US011088104B2

United States Patent
Persons et al.

(10) Patent No.: US 11,088,104 B2
(45) Date of Patent: Aug. 10, 2021

(54) PROCESS FOR FORMING AN ELECTRIC HEATER

(71) Applicant: Heraeus Precious Metals North America Conshohocken LLC, West Conshohocken, PA (US)

(72) Inventors: Ryan Persons, Newtown Square, PA (US); Sebastian Fritzsche, Hanau (DE); Steffan Käss, Hanau (DE); Tanja Dickel, Hanau (DE)

(73) Assignee: HERAEUS PRECIOUS METALS NORTH AMERICA CONSHOHOCKEN LLC, West Conshohocken, PA (US)

( * ) Notice: Subject to any disclaimer, the term of this patent is extended or adjusted under 35 U.S.C. 154(b) by 183 days.

(21) Appl. No.: 16/659,819

(22) Filed: Oct. 22, 2019

(65) Prior Publication Data

US 2020/0194398 A1 Jun. 18, 2020

Related U.S. Application Data

(60) Provisional application No. 62/780,552, filed on Dec. 17, 2018.

(51) Int. Cl.
| | |
|---|---|
| *B23K 1/08* | (2006.01) |
| *H01L 23/00* | (2006.01) |
| *H05B 3/12* | (2006.01) |
| *B23K 1/00* | (2006.01) |

(52) U.S. Cl.
CPC ............... *H01L 24/29* (2013.01); *B23K 1/00* (2013.01); *H01L 24/83* (2013.01); *H05B 3/12* (2013.01); *B22F 2301/10* (2013.01); *H01L 2224/8382* (2013.01); *H01L 2924/0105* (2013.01); *H01L 2924/01029* (2013.01); *H05B 2203/013* (2013.01)

(58) Field of Classification Search
CPC . B23K 1/00; B23K 1/08; B23K 1/002; B23K 1/005; B23K 31/02; B23K 3/04; B23K 20/026; B22F 2301/10; H05B 2203/016; H05B 2203/013; H05B 3/12; H01L 24/29; H01L 24/83; H01L 2224/8382; H01L 2924/0105; H01L 2924/01029; H01L 23/00
USPC ........................................................ 228/193
See application file for complete search history.

(56) References Cited

U.S. PATENT DOCUMENTS

| | | | | |
|---|---|---|---|---|
| 2004/0050910 A1* | 3/2004 | Sullivan | .................. | B23K 1/012 228/119 |
| 2004/0099708 A1* | 5/2004 | Hiramatsu | ........ | H01L 21/68785 228/8 |

FOREIGN PATENT DOCUMENTS

WO    WO-2016030287 A1    3/2016

* cited by examiner

*Primary Examiner* — Chuong A Luu
(74) *Attorney, Agent, or Firm* — Blank Rome LLP

(57) ABSTRACT

A process for forming an electric heater comprising the steps:

(a) providing a heater element and a power supply, (b) applying a layer of a copper paste onto the heater element and/or the power supply and drying the applied layer of copper paste, (c1) applying a solder agent onto the dried copper paste and appropriately arranging the heater element and the power supply such that the heater element and the power supply contact each other by means of the dried copper paste and the solder agent or (c2) appropriately arranging the heater element and the power supply such that the heater element and the power supply contact each other by means of the dried copper paste, and applying a solder agent next to the dried copper paste or (c3) if in step (b) the copper paste has been applied only onto the heater element and then dried, applying a solder agent onto the power supply and appropriately arranging the heater element and the power supply such that the heater element and the power supply contact each other by means of the dried copper paste and the solder agent or (c4) if in step (b) the copper paste has been applied only onto the power supply and then dried, applying a solder agent onto the heater element and appropriately arranging the heater element and the power supply such that the heater element and the power supply contact each other by means of the dried copper paste and the solder agent, and (d) diffusion soldering the arrangement produced in step (c1), (c2), (c3) or (c4) to form a connection between the heater element and the power supply, wherein the copper paste comprises or consists of (i) 66-99 wt.-% of at least one type of particles selected from the group consisting of copper particles, copper-rich copper/zinc alloy particles, and copper-rich copper/tin alloy particles, (ii) 0-20 wt.-% of at least one type of solder particles selected from the group consisting of tin particles, tin-rich tin/copper alloy particles, tin-rich tin/silver alloy particles, and tin-rich tin/copper/silver alloy particles, and (iii) 1-20 wt.-% of a vehicle.

11 Claims, No Drawings

PROCESS FOR FORMING AN ELECTRIC HEATER

This application claims the benefit of U.S. Provisional Application No. 62/780,552 filed Dec. 17, 2018, the entire contents of which are incorporated by reference herein.

The present invention relates to a process for forming (process for making, process for the manufacture of) an electric heater, in particular, to a process for forming an electric heater comprising a heater element and a power supply connected to each other by a diffusion solder.

WO 2016/030287 A1 discloses the joining of an electronic component to a substrate by diffusion soldering. The joining method comprises application of a copper paste onto at least one of the surfaces to be connected and drying the layer of copper paste. Then, either a solder agent is applied onto the dried layer of copper paste and the electronic component and the substrate are arranged such that they contact each other by means of the combination of dried copper paste and solder agent, or the electronic component and the substrate are arranged such that they contact each other by means of the dried copper paste and a solder agent is applied next to the layer of dried copper paste. Thereafter the arrangement so produced is diffusion soldered.

State of the art electric heaters comprise a heater element which is electrically connected to a power supply, typically by a tin- or lead-based solder connection. Especially in case of electric heaters having a heater element operating in an elevated temperature range of, for example, 200-250° C., such solder connection is typically a lead-based solder. Lead is a hazardous material and needs to be replaced by a less problematic material. A solution is to make said electrical connection from a silver sintering material. However, the applicant has now found a process which offers an effective alternative to silver sintering for electrically connecting a heater element to a power supply of an electric heater, in particular even in case of electric heaters with a heater element having an operational temperature (i.e. the operational temperature of the heater element itself) in said elevated temperature range.

The present invention relates to a process for forming an electric heater comprising the steps:
(a) providing a heater element and a power supply,
(b) applying a layer of a copper paste onto the heater element and/or the power supply and drying the applied layer of copper paste,
(c1) applying a solder agent onto the dried copper paste and appropriately arranging the heater element and the power supply such that the heater element and the power supply contact each other by means of the dried copper paste and the solder agent
or
(c2) appropriately arranging the heater element and the power supply such that the heater element and the power supply contact each other by means of the dried copper paste, and applying a solder agent next to the dried copper paste
or
(c3) if in step (b) the copper paste has been applied only onto the heater element and then dried, applying a solder agent onto the power supply and appropriately arranging the heater element and the power supply such that the heater element and the power supply contact each other by means of the dried copper paste and the solder agent
or
(c4) if in step (b) the copper paste has been applied only onto the power supply and then dried, applying a solder agent onto the heater element and appropriately arranging the heater element and the power supply such that the heater element and the power supply contact each other by means of the dried copper paste and the solder agent, and
(d) diffusion soldering the arrangement produced in step (c1), (c2), (c3) or (c4) to form a connection between the heater element and the power supply, wherein the copper paste comprises or consists of (i) 66-99 wt.-% (weight-%, % by weight) of at least one type of particles selected from the group consisting of copper particles, copper-rich copper/zinc alloy particles, and copper-rich copper/tin alloy particles, (ii) 0-20 wt.-% of at least one type of solder particles selected from the group consisting of tin particles, tin-rich tin/copper alloy particles, tin-rich tin/silver alloy particles, and tin-rich tin/copper/silver alloy particles, and (iii) 1-20 wt.-% of a vehicle.

Accordingly there are four embodiments of the process for forming an electric heater.

A first embodiment is a process for forming an electric heater comprising the steps:
(a) providing a heater element and a power supply,
(b) applying a layer of a copper paste onto the heater element and/or the power supply and drying the applied layer of copper paste,
(c1) applying a solder agent onto the dried copper paste and appropriately arranging the heater element and the power supply such that the heater element and the power supply contact each other by means of the dried copper paste and the solder agent, and
(d) diffusion soldering the arrangement produced in step (c1) to form a connection between the heater element and the power supply, wherein the copper paste comprises or consists of (i) 66-99 wt.-% of at least one type of particles selected from the group consisting of copper particles, copper-rich copper/zinc alloy particles, and copper-rich copper/tin alloy particles, (ii) 0-20 wt.-% of at least one type of solder particles selected from the group consisting of tin particles, tin-rich tin/copper alloy particles, tin-rich tin/silver alloy particles, and tin-rich tin/copper/silver alloy particles, and (iii) 1-20 wt.-% of a vehicle.

A second embodiment is a process for forming an electric heater comprising the steps:
(a) providing a heater element and a power supply,
(b) applying a layer of a copper paste onto the heater element and/or the power supply and drying the applied layer of copper paste,
(c2) appropriately arranging the heater element and the power supply such that the heater element and the power supply contact each other by means of the dried copper paste, and applying a solder agent next to the dried copper paste, and
(d) diffusion soldering the arrangement produced in step (c2) to form a connection between the heater element and the power supply, wherein the copper paste comprises or consists of (i) 66-99 wt.-% of at least one type of particles selected from the group consisting of copper particles, copper-rich copper/zinc alloy particles, and copper-rich copper/tin alloy particles, (ii) 0-20 wt.-% of at least one type of solder particles selected from the group consisting of tin particles, tin-rich tin/copper alloy particles, tin-rich tin/silver alloy particles, and tin-rich tin/copper/silver alloy particles, and (iii) 1-20 wt.-% of a vehicle.

A third embodiment is a process for forming an electric heater comprising the steps:
(a) providing a heater element and a power supply, (b) applying a layer of a copper paste only onto the heater element and drying the applied layer of copper paste, (c3) applying a solder agent onto the power supply and appropriately arranging the heater element and the power supply such that the heater element and the power supply contact each other by means of the dried copper paste and the solder agent, and (d) diffusion soldering the arrangement produced in step (c3) to form a connection between the heater element and the power supply, wherein the copper paste comprises or consists of (i) 66-99 wt.-% of at least one type of particles selected from the group consisting of copper particles, copper-rich copper/zinc alloy particles, and copper-rich copper/tin alloy particles, (ii) 0-20 wt.-% of at least one type of solder particles selected from the group consisting of tin particles, tin-rich tin/copper alloy particles, tin-rich tin/silver alloy particles, and tin-rich tin/copper/silver alloy particles, and (iii) 1-20 wt.-% of a vehicle.

A fourth embodiment is a process for forming an electric heater comprising the steps:

(a) providing a heater element and a power supply, (b) applying a layer of a copper paste only onto the power supply and drying the applied layer of copper paste, (c4) applying a solder agent onto the heater element and appropriately arranging the heater element and the power supply such that the heater element and the power supply contact each other by means of the dried copper paste and the solder agent, and (d) diffusion soldering the arrangement produced in step (c4) to form a connection between the heater element and the power supply, wherein the copper paste comprises or consists of (i) 66-99 wt.-% of at least one type of particles selected from the group consisting of copper particles, copper-rich copper/zinc alloy particles, and copper-rich copper/tin alloy particles, (ii) 0-20 wt.-% of at least one type of solder particles selected from the group consisting of tin particles, tin-rich tin/copper alloy particles, tin-rich tin/silver alloy particles, and tin-rich tin/copper/silver alloy particles, and (iii) 1-20 wt.-% of a vehicle.

The term "electric heater" used herein means a heating device (a device for the supply of heat) comprising a heater element connected to a power supply. The heater element converts electrical energy into heat. Typically, an electric heater is a heating device as part of a more complex device or apparatus. Examples of such more complex devices include so-called brown goods like, for example, pressing irons, electric kettles, coffee makers, steamers and hot plates; so-called white goods like, for example, clothes dryers, washing machines and dishwashers; lifestyle goods like, for example, e-cigarettes, hair straighteners and hair dryers; automotive applications like, for example, automotive seat heaters and window/mirror defrosters.

The heater element is the technical component of the electric heater that converts electrical energy into heat by way of resistive or Joule heating. The heater element can be made of a variety of different materials. It can comprise only one material or more than one material. Examples of such materials include conductor materials (e.g. silver, copper, platinum, palladium or any combination or alloy thereof) and resistor materials (e.g. ruthenium oxide, ruthenium oxide/silver, ruthenium oxide/palladium, nickel-chrome-alloys, tungsten, molybdenum).

The heater element is neither a semiconductor, nor is it another electronic component like those typically used in electronics or microelectronics. It is also not a substrate; in particular it is not a substrate like those typically used in electronics or microelectronics; hence, it is in particular neither a leadframe nor is it a printed circuit board, a ceramic substrate, a metal-ceramic substrate (like a DCB or the like) or an insulated metal substrate.

The heater element can comprise a connection part and a heat generating part. The connection part of the heater element is the part of the heater element that is to be connected to the power supply.

In a first embodiment, the heat generating part can be in direct physical and electrical connection to the connection part of the heater element.

In a second embodiment, the heat generating part and the connection part of the heater element can be designed as a one-piece heater element.

The layout (i.e. shape and size) of the heat generating part of the heater element is determined by type, design and function of the electric heater. In an embodiment, the connection part and the heat generating part of the heater element can be made of one and the same material or of one and the same material combination (e.g. the entire heater element may be made of silver or of silver/platinum). In another embodiment, the connection part and the heat generating part of the heater element can be made of different materials or of different material combinations (e.g. the connection part may be made of silver or silver/platinum and the heat generating part may be made of ruthenium oxide/silver).

The heater element can comprise a material or a material combination that may be formed from a conductor paste and/or from a resistor paste, i.e. the heater element can be produced by applying and drying a conductor paste and/or a resistor paste, and finally heating the dried conductor paste and/or resistor paste to an elevated temperature in order to form the heater element. Preferably, the heater element consists of such type of material or material combination.

Examples of conductor pastes include C 4727, available from Heraeus Deutschland GmbH & Co. KG, Germany. Examples of resistor pastes include R 2200 Series, available from Heraeus Deutschland GmbH & Co. KG, Germany.

The term "power supply" used herein means an electrical connection by which an external electrical power can be applied to the heater element of the electric heater or, to be more precise, to the connection part of the heater element of the electric heater. Examples of power supplies include surface mountable components (e.g. quick connects, resistance temperature detectors (RTDs) and/or capacitors) and, in particular, lead wires of various materials. Examples of such lead wires include silver wires, copper wires, aluminum wires, steel wires and platinum wires.

In step (b) of the process of the invention a layer of a copper paste is applied onto the heater element and/or onto the power supply and then dried. In other words, the copper paste is applied onto a contact surface of the connection part of the heater element and/or onto a contact surface of the power supply. In an embodiment, the power supply and/or the heater element may be coated with a metallization layer at their contact surface, i.e. the surface that comes into contact with the copper paste.

Application of the copper paste can be effected through any conventional method known to the skilled person, for example, by screen printing, stencil printing, jetting or dispensing.

The copper paste comprises (i) 66-99 wt.-%, preferably 68-95 wt.-%, and more preferably 70-92 wt.-% of at least one type of particles selected from the group consisting of copper particles, copper-rich copper/zinc alloy particles, and copper-rich copper/tin alloy particles, (ii) 0-20 wt.-%, preferably 5-15 wt.-% of at least one type of solder particles selected from the group consisting of tin particles, tin-rich tin/copper alloy particles, tin-rich tin/silver alloy particles, and tin-rich tin/copper/silver alloy particles, and (iii) 1-20 wt.-%, preferably 5-15 wt.-%, of a vehicle.

Preferably, the copper paste consists of (i) 66-99 wt.-wt.-%, preferably 68-95 wt.-%, and more preferably 70-92 wt.-% of at least one type of particles selected from the group consisting of copper particles, copper-rich copper/zinc alloy particles, and copper-rich copper/tin alloy particles, (ii) 0-20 wt.-%, preferably 5-15 wt.-% of at least one type of solder particles selected from the group consisting of tin particles, tin-rich tin/copper alloy particles, tin-rich tin/silver alloy particles, and tin-rich tin/copper/silver alloy particles, and (iii) 1-20 wt.-%, preferably 5-15 wt.-%, of a vehicle.

The purity of the copper of the copper particles (i) contained in the copper paste preferably is at least 99.9 wt.-% (3 N) and more preferably at least 99.99 wt.-% (4 N). In the case of the particles made of copper-rich copper/zinc alloys and/or copper-rich copper/tin alloys, the composition is 60-99.5 wt.-% copper and, correspondingly, 0.5-40 wt.-% zinc or tin. Preferably, the particles (i) are particles produced by atomization of a copper or copper alloy melt in an inert gas atmosphere or, in other words, particles produced by atomization of liquid copper or copper alloy into an inert gas atmosphere.

If the copper paste contains tin-rich tin/copper, tin/silver and/or tin/copper/silver alloy particles, it is preferred that the tin fraction thereof is in the range of 95-99.5 wt.-% and the copper and/or silver fraction is in the range of 0.5-5 wt.-%.

The mean particle diameter of particles (i) can be, for example, ≤30 µm, preferably ≤20 µm, more preferably ≤15 µm, and even more preferably ≤10 µm. Preferably, the mean particle diameter can be in the range of 1-30 µm, more preferably in the range of 1-20 µm, even more preferably in the range of 1-15 µm, and yet even more preferably in the range of 1-10 µm.

The mean particle diameter of particles (ii) can be, for example, ≤80 µm, preferably ≤50 µm, more preferably ≤30 µm, and even more preferably ≤20 µm. Preferably, the mean particle diameter can be in the range of 1-80 µm, more preferably in the range of 1-50 µm, even more preferably in the range of 1-30 µm, and yet even more preferably in the range of 1-20 µm.

The term "mean particle diameter" used herein means the mean particle size (d50) that can be determined with an optical microscope. Measurements of this type can be made with an optical microscope, for example at 200-fold magnification, in combination with a common digital image processing system (CCD digital camera and analytical software), for example with a measuring system from Microvision Instruments. For example, a mean particle diameter of ≤15 µm can mean that at least 90% of the particles have a particle diameter≤15 µm and less than 10% of the particles have a particle diameter of more than 15 µm. Accordingly, a mean particle diameter being in the range of 2-15 µm means that at least 90% of the particles have a particle diameter in the range of 2-15 µm and less than 10% of the particles have a particle diameter of less than 2 µm or more than 15 µm.

The particles (i) and (ii) can have different shapes. However, it is preferred that particles (i) and (ii) have a spherical shape. It is preferred that at least 90 wt.-%, more preferably at least 95 wt.-%, even more preferably at least 99 wt.-% or 100 wt.-% of particles (i) and (ii) have a spherical shape.

In addition to the particles of type (i) and, if applicable, (ii), the copper paste comprises a so-called vehicle (iii), which comprises or consists of one or more, possibly modified, natural thickening agents (for example, gelatine, starch, pectin, cellulose ether, esters of natural organic oils) and one or more organic solvents (for example, glycol, glycerol, terpineol, aliphatic hydrocarbons). The thickening agent fraction of the vehicle is, for example, 0.5-15 wt.-%, preferably 2-10 wt.-%, and more preferably 4-7 wt.-%, whereas the organic solvent fraction is 85-99.5 wt.-%, preferably 90-98 wt.-%, and more preferably 93-96 wt.-%.

The copper paste is applied at a wet layer thickness of, for example, 20-500 µm, preferably 20-300 µm, and then dried for, for example, 10-60 minutes at an object temperature of, for example, 50-160° C.

After conclusion of step (b), process step (c) follows or, to be more precise, process step (c) follows in one of its four embodiments (c1), (c2), (c3) or (c4).

The solder agent used in process step (c) can be a solder paste comprising a solder metal or a solder alloy and a solder flux or a vehicle, or the solder agent may be one or more moulded parts or preforms made of solder metal or solder alloy.

Referring to a solder agent in the form of a solder paste, the latter may comprise 80-99 wt.-%, preferably 85-95 wt.-%, and more preferably 87-92 wt.-% of at least one type of particles selected from the group consisting of tin particles, tin-rich tin/copper alloy particles, tin-rich tin/silver alloy particles, and tin-rich tin/copper/silver alloy particles, and 1-20 wt.-%, preferably 5-15 wt.-%, and more preferably 8-13 wt.-%, of a solder flux or a vehicle.

Preferably, the solder paste consists of 80-99 wt.-%, preferably 85-95 wt.-%, and more preferably 87-92 wt.-% of at least one type of particles selected from the group consisting of tin particles, tin-rich tin/copper alloy particles, tin-rich tin/silver alloy particles, and tin-rich tin/copper/silver alloy particles, and 1-20 wt.-%, preferably 5-15 wt.-%, and more preferably 8-13 wt.-%, of a solder flux or a vehicle.

If the solder paste comprises tin-rich tin/copper alloy particles, tin/silver alloy particles and/or tin/copper/silver alloy particles as solder alloy, the tin fraction thereof is preferably in the range of 95-99.5 wt.-%, whereas the copper and/or silver fraction is in the range of 0.5-5 wt.-%.

With regard to the mean particle diameters of the tin particles or tin-rich alloy particles, the same applies as specified above with regard to the mean particle diameters of particles (ii).

If the solder paste comprises solder flux, the solder flux serves to reduce (de-oxidize) the contact surface of the heater element and/or the power supply during the diffusion soldering process, to prevent renewed oxide formation before and after the diffusion soldering process of step (d), and to reduce the inclusion of foreign substances. Moreover, the solder flux can reduce the surface tension of the liquid solder. For example, colophony, colophony-based resin systems, water-based resin systems or systems based on carboxylic acids (e.g. carboxylic acids such as citric acid, adipic acid, cinnamic acid, and benzilic acid), amines (e.g. tertiary amines), and solvents (e.g. polar solvents like water and/or a polyol such as glycol or glycerol) can be used as solder flux.

The solder paste may comprise further ingredients such as, for example, alcohols, fatty acids (e.g. saturated fatty acids, such as oleic acid, myristic acid, palmitic acid, margaric acid, stearic acid or eicosanoic acid), polysiloxane compounds or phosphide compounds.

As mentioned above, the solder paste may comprise a so-called vehicle instead of a solder flux. In order to avoid unnecessary repetition, reference shall be made to the disclosure regarding the vehicle that has been provided above in the context of the description of the copper paste.

The application of the solder paste in process step (c) can be effected through any conventional method known to the skilled person, for example, by screen printing, stencil printing, jetting or dispensing.

In the embodiment of the process according to the invention that comprises process step (c1), the solder paste is applied onto the dried copper paste layer. The solder preferably covers at least 50%, more preferably at least 70%, even more preferably at least 90%, and most preferably at least 95%, such as, for example, 100% of the dried copper paste layer. In another embodiment of the process according to the invention that comprises process step (c1) the solder paste can be applied at least partially overlapping the dried copper paste layer, i.e. the solder paste may cover at least partially an edge of the dried copper paste layer.

In the embodiment of the process according to the invention that comprises process step (c2), the solder paste is applied next to the dried copper paste layer. In this embodiment, the solder paste can touch the dried copper paste layer from the side or can be situated at a short distance of, for example, up to 2 mm from the dried copper paste layer; during the diffusion soldering in process step (d) later on, the solder paste begins to flow and, supported by the capillary effect, infiltrates the dried copper paste matrix.

In the embodiment of the process according to the invention that comprises process step (c3), the solder paste is applied onto the power supply.

In the embodiment of the process according to the invention that comprises process step (c4), the solder paste is applied onto the heater element.

The solder paste is applied at a wet layer thickness of, for example, 20-500 µm, preferably 20-300 µm, and then dried for, for example, 10-60 minutes at an object temperature of, for example, 50-160° C.

The solder agent in the form of at least one moulded part or preform of solder metal or solder alloy is, for example, a bead, ball, powder, foil, wire or cylinder. The moulded parts or preforms are selected from the group consisting of tin moulded parts or preforms, tin-rich tin/copper alloy moulded parts or preforms, tin-rich tin/silver alloy moulded parts or preforms, and tin-rich tin/copper/silver alloy moulded parts or preforms. In the case of the tin-rich tin/copper, tin/silver and/or tin/copper/silver alloys, the tin fraction thereof is, for example, in the range of 95-99.5 wt.-%, whereas the copper and/or silver fraction is in the range of 0.5-5 wt.-%.

The application of the at least one moulded part or preform of solder metal or solder alloy (hereinafter for brevity also called "at least one solder part or preform") usually consists of simply placing it.

In the embodiment of the process according to the invention that comprises process step (c1), at least one moulded part or preform of solder metal or solder alloy is placed on the dried copper paste. In one embodiment, the at least one solder part or preform has the same size and shape as the dried copper paste layer. In another embodiment, the at least one solder part or preform is bigger or smaller in size than the dried copper paste layer.

In the embodiment of the process according to the invention that comprises process step (c2), the at least one moulded part or preform of solder metal or solder alloy is placed next to the dried copper paste. In this embodiment, the at least one solder part or preform can touch the dried copper paste from the side or can be situated at a short distance of, for example, up to 2 mm from the dried copper paste; during the diffusion soldering in process step (d) later on, the at least one solder part or preform begins to melt and flow and, supported by the capillary effect, infiltrates the dried copper paste matrix.

In the embodiment of the process according to the invention that comprises process step (c3), the at least one moulded part or preform of solder metal or solder alloy is placed onto the power supply and the heater element and the power supply are appropriately arranged such that the heater element and the power supply contact each other by means of the dried copper paste and the at least one solder part or preform. In this embodiment, the at least one solder part or preform can touch the dried copper paste; during the diffusion soldering in process step (d) later on, the at least one solder part or preform begins to melt and flow and, supported by the capillary effect, infiltrates the dried copper paste matrix.

In the embodiment of the process according to the invention that comprises process step (c4), the at least one moulded part or preform of solder metal or solder alloy is placed onto the heater element and the heater element and the power supply are appropriately arranged such that the heater element and the power supply contact each other by means of the dried copper paste and the at least one solder part or preform. In this embodiment, the at least one solder part or preform can touch the dried copper paste; during the diffusion soldering in process step (d) later on, the at least one solder part or preform begins to melt and flow and, supported by the capillary effect, infiltrates the dried copper paste matrix.

Preferably, neither the copper paste nor the solder agent contain lead and they are therefore preferably lead-free. Being lead-free shall mean that the copper paste and the solder agent do not comprise lead except for optionally present contaminating lead that may be present due to technical reasons. Accordingly, lead-free shall be understood to mean a lead content of less than 1 wt.-%, preferably of less than 0.5 wt.-%, more preferably of less than 0.1 wt.-%, even more preferably of less than 0.01 wt.-% and in particular of 0 wt.-%, based on the weight of the copper paste or respectively based on the weight of the solder agent.

After conclusion of step (c) the so-produced arrangement comprising heater element, power supply, dried copper paste and solder agent is diffusion soldered in step (d) to form a mechanical and electrical connection between the connection part of the heater element and the power supply. To this end, said arrangement is heated, preferably evenly until the actual diffusion soldering temperature is reached. According to a preferred embodiment, the heating proceeds at a rate of ≤3° C. per second. Preferably, the diffusion soldering temperature is 10-50° C., more preferably 15-45° C., and even more preferably 25-35° C., for example, 30° C. above the melting temperature of the solder metal or solder alloy of the solder agent. According to another preferred embodiment, the diffusion soldering temperature is below 280° C., for example in the range of 240-260° C. The diffusion soldering temperature is kept above the liquidus temperature of the solder metal or solder alloy of the solder agent for a period of at least 15 seconds, preferably of at least 20 seconds, and even more preferably of at least 30 seconds.

After conclusion of step (d) it may be advantageous to subject the diffusion soldered arrangement (i.e. the electric heater) to a heat treatment. Heat treatment means treating the diffusion soldered arrangement with heat below the liquidus temperature of the diffusion solder formed in step (d). The heat treatment preferably proceeds at a temperature above 40° C., for example in the range of 40-217° C., more preferably in the range of 100-210° C., and even more preferably in the range of 150-205° C. The heat treatment preferably proceeds for a duration of 1 minute to 24 hours, more preferably for 10 minutes to 10 hours, and even more preferably for 20 minutes to 1 hour. The duration of the heat treatment is usually correlated with the temperature and is the longer, the lower the heat treatment temperature.

The electric heater as product obtained by the process of the present invention comprises the heater element and the power supply connected via their contact surfaces by a layer of diffusion solder in between having a layer thickness (i.e. after diffusion soldering) in the range of, for example, 20 to 500 µm.

It is advantageous, that the arrangement formed after conclusion of step (d) or after said optional heat treatment, i.e. the electric heater so formed, can be used at an operational temperature in the range of 50-500° C., preferably in the range of 100-400° C., more preferably in the range of 120-350° C. and most preferably in the range of 150-300° C. The operational temperature may be constant or it may vary up and down within said operational temperature range during heat supply operation. It is also advantageous that the electric heater withstands a huge number of on/off cycles without showing signs of material fatigue, provided the upper limit of the operational temperature range is not exceeded.

Hence, the invention relates also to an electric heater formed by the process of the present invention. The invention relates furthermore also to the use of the electric heater for supplying heat at an operational temperature in the range of 50-500° C., preferably in the range of 100-400° C., more preferably in the range of 120-350° C. and most preferably in the range of 150-300° C.; in other words, the invention relates also to a process for the supply of heat making use of the electric heater at an operational temperature in the range of 50-500° C., preferably in the range of 100-400° C., more preferably in the range of 120-350° C. and most preferably in the range of 150-300° C.

The invention claimed is:

1. A process for forming an electric heater comprising:
   (a) providing a heater element and a power supply;
   (b) applying a layer of a copper paste onto the heater element and/or the power supply and drying the applied layer of the copper paste;
   (c1) applying a solder agent onto the dried copper paste and appropriately arranging the heater element and the power supply such that the heater element and the power supply contact each other by means of the dried copper paste and the solder agent, or
   (c2) appropriately arranging the heater element and the power supply such that the heater element and the power supply contact each other by means of the dried copper paste, and applying a solder agent next to the dried copper paste, or
   (c3) if in step (b) the copper paste has been applied only onto the heater element and then dried, applying a solder agent onto the power supply and appropriately arranging the heater element and the power supply such that the heater element and the power supply contact each other by means of the dried copper paste and the solder agent, or
   (c4) if in step (b) the copper paste has been applied only onto the power supply and then dried, applying a solder agent onto the heater element and appropriately arranging the heater element and the power supply such that the heater element and the power supply contact each other by means of the dried copper paste and the solder agent; and
   (d) diffusion soldering the arrangement produced in step (c1), (c2), (c3) or (c4) to form a connection between the heater element and the power supply,
   wherein the copper paste comprises or consists of (i) 66-99 wt.-% of at least one type of particles selected from the group consisting of copper particles, copper-rich copper/zinc alloy particles, and copper-rich copper/tin alloy particles, (ii) 0-20 wt.-% of at least one type of solder particles selected from the group consisting of tin particles, tin-rich tin/copper alloy particles, tin-rich tin/silver alloy particles, and tin-rich tin/copper/silver alloy particles, and (iii) 1-20 wt.-% of a vehicle.

2. The process of claim 1, wherein the electric heater forms a heating device as part of a more complex device.

3. The process of claim 2, wherein the more complex device is selected among brown goods, white goods, lifestyle goods and automotive applications.

4. The process of claim 1, wherein the copper paste is applied by screen printing, stencil printing, jetting or dispensing.

5. The process of claim 1, wherein the particles of (i) are particles produced by atomization of a copper or copper alloy melt in an inert gas atmosphere.

6. The process of claim 1, wherein the particles of (i) and (ii) have a spherical shape.

7. The process of claim 1, wherein the solder agent is a solder paste or one or more moulded parts or preforms made of a solder metal or a solder alloy.

8. The process of claim 1, wherein the copper paste and the solder agent are lead-free.

9. The process of claim 1, wherein the copper paste is applied at a wet layer thickness of 20-500 µm and then dried for 10-60 minutes at an object temperature of 50-160° C.

10. An electric heater formed by a process according to claim 1.

11. A process for the supply of heat, wherein an electric heater formed by a process of claim 1 is used at an operational temperature in the range of 50-500° C.

* * * * *